United States Patent
Kanazawa et al.

(10) Patent No.: US 10,173,296 B2
(45) Date of Patent: Jan. 8, 2019

(54) GRINDING MACHINE

(71) Applicant: TOKYO SEIMITSU CO., LTD, Tokyo (JP)

(72) Inventors: Masaki Kanazawa, Tokyo (JP); Kenji Igarashi, Tokyo (JP)

(73) Assignee: Tokyo Seimitsu Co., Ltd., Tokyo (JP)

( * ) Notice: Subject to any disclaimer, the term of this patent is extended or adjusted under 35 U.S.C. 154(b) by 0 days.

(21) Appl. No.: 15/751,421

(22) PCT Filed: Sep. 29, 2016

(86) PCT No.: PCT/JP2016/078782
§ 371 (c)(1),
(2) Date: Feb. 8, 2018

(87) PCT Pub. No.: WO2017/057548
PCT Pub. Date: Apr. 6, 2017

(65) Prior Publication Data
US 2018/0229341 A1    Aug. 16, 2018

(30) Foreign Application Priority Data

Sep. 30, 2015 (JP) ................. 2015-194484
Jun. 30, 2016 (JP) ................. 2016-131107

(51) Int. Cl.
*B24B 7/04* (2006.01)
*B24B 47/14* (2006.01)
(Continued)

(52) U.S. Cl.
CPC .............. *B24B 7/04* (2013.01); *B24B 37/005* (2013.01); *B24B 41/047* (2013.01); *B24B 47/14* (2013.01);
(Continued)

(58) Field of Classification Search
CPC ....... B24B 7/04; B24B 37/005; B24B 41/047; B24B 47/14; B24B 49/08; B24B 49/16; H01L 21/304
(Continued)

(56) References Cited

U.S. PATENT DOCUMENTS 3,988,965 A * 11/1976 Cayen ................. B23Q 11/001
                                                                  409/237
4,616,447 A * 10/1986 Haas ....................... B23Q 5/22
                                                                  451/164
(Continued)

FOREIGN PATENT DOCUMENTS

JP      2001191237      7/2001
JP      2003007661      1/2003
(Continued)

*Primary Examiner* — Eileen Morgan
(74) *Attorney, Agent, or Firm* — Fattibene and Fattibene LLC; Paul A. Fattibene

(57) ABSTRACT

A grinding machine includes a rotatable spindle having a lower end to which a grindstone for grinding a wafer is attached; linear guides supporting the spindle slidably to a column; a spindle feeding mechanism feeding the spindle in a vertical direction; and constant-pressure feeding mechanism interposed between the spindle feeding mechanism and the column and suspending the spindle feeding mechanism. The constant-pressure feeding mechanism raises the spindle feeding mechanism in the vertical direction when a friction force acting on the grindstone is higher than a predetermined value.

4 Claims, 7 Drawing Sheets

(51) Int. Cl.
*B24B 37/005* (2012.01)
*B24B 41/047* (2006.01)
*B24B 49/08* (2006.01)
*B24B 49/16* (2006.01)
*H01L 21/304* (2006.01)

(52) U.S. Cl.
CPC .............. *B24B 49/08* (2013.01); *B24B 49/16* (2013.01); *H01L 21/304* (2013.01)

(58) Field of Classification Search
USPC ................ 451/10, 11, 14, 41, 280, 285, 290
See application file for complete search history.

(56) References Cited

U.S. PATENT DOCUMENTS

| | | | | |
|---|---|---|---|---|
| 5,123,789 | A * | 6/1992 | Ohtani | .................. B23Q 3/002 |
| | | | | 408/1 R |
| 6,910,946 | B2 * | 6/2005 | Yoon | ....................... B24B 19/26 |
| | | | | 451/10 |
| 2013/0316619 | A1 * | 11/2013 | Bradnam | ................ B24B 3/363 |
| | | | | 451/11 |

FOREIGN PATENT DOCUMENTS

| | | |
|---|---|---|
| JP | 2003071710 | 3/2003 |
| JP | 2004322215 | 11/2004 |
| JP | 2007210074 | 8/2007 |
| JP | 2009272323 | 11/2009 |
| JP | 2012040620 | 3/2012 |
| JP | 2012223863 | 11/2012 |
| JP | 2013128070 | 6/2013 |
| JP | 2015054373 | 3/2015 |

\* cited by examiner

GRINDING MACHINE

BACKGROUND OF INVENTION

1. Field of Invention

The present invention relates to a grinding machine for grinding the backside of a wafer, and in particular a grinding machine capable of grinding a fragile wafer without damaging the same.

2. Description of Related Art

In a semiconductor manufacturing field, in order to form a semiconductor wafer (hereinafter, called "wafer") such as a silicon wafer into a thin film, backgrinding for grinding the backside of the wafer has been performed.

As a grinding machine for performing wafer backgrinding, as shown in FIG. 6A, a grinding machine 40 is known that is provided with a column 41, a spindle 43 supported to the column 41 via a ball screw 42 in a cantilever-like manner, and a grindstone 44 attached to a lower end of the spindle 43, wherein the spindle 43 is lowered by the ball screw 42 while the spindle 43 is being rotated, and a wafer W placed on a chuck 45 is ground by the grindstone 44 (for example, Japanese Patent Application Laid-Open No. 2003-007661).

In such a grinding machine 40, as shown in FIG. 6B, an attitude of the spindle 43 can incline due to a reaction force during grinding, so that there is a possibility that the wafer W cannot be processed into a desired shape or a so-called twill line is formed on the backside of the wafer W, which results in damage to the wafer W.

In order to suppress the inclination of the spindle during such grinding, in Patent Literature 1, a semiconductor substrate grinding machine is disclosed that is provided with a guide for sliding a grinding mechanism holding a grinding member in a horizontal direction, a constant-speed moving mechanism for moving the grinding mechanism to a semiconductor substrate at a constant speed to grind the semiconductor substrate, and a constant-pressure moving mechanism for moving the grinding mechanism to the semiconductor substrate such that the semiconductor substrate and the grinding mechanism are pressed with a constant pressure after grinding performed by the constant-speed moving mechanism.

Further, in Patent Literature 2, a grinding machine is disclosed, wherein a grinding wheel is so provided as to be slidable in a vertical direction via a linear guide, and the grinding wheel lowers according to a desired grinding quantity to perform infeed grinding of the backside of a wafer.

PRIOR ART LITERATURE

Patent Literature

Patent Literature 1: Japanese Patent Application Laid-Open No. 2009-272323
Patent Literature 2: Japanese Patent No. 5582916

SUMMARY OF INVENTION

However, in the semiconductor substrate grinding machine described in Patent Literature 1 or such a grinding machine described in Patent Literature 2, since the grindstone is moved according to accumulation feeding due to a sliding resistance occurring in the guide when the guide brings the grindstone close to the wafer, it is difficult to cut the wafer by a fine grinding quantity. When a cutting depth of the grindstone (abrasive grain) is larger than a critical cutting depth (Dc value) of a wafer, as shown in FIG. 7, there is a possibility that a fragile mode grinding where a chip or a crack may occur in the wafer during grinding of the wafer takes place.

For example, in the configuration shown in Patent Literature 1, since the guide feeding a grinding mechanism in a horizontal direction is installed below a processing point at which the grinding mechanism grinds a wafer, a moment can occur between the grinding mechanism and the guide, depending on a processing resistance during processing, and there is such a possibility that the grinding mechanism and the wafer may become slightly non-parallel.

Further, in the configuration shown in Patent Literature 2, when processing is performed while the grindstone is being fed at a constant speed, if the grindstone continues giving cutting despite sequential changes of sharpness of abrasive grain tips, the individual abrasive grains may give a wafer cutting equal to or more than a limit above which a crack occurs. As a result, there is a possibility that a fine chip, a crack or the like may be generated in a wafer surface by actual abrasive grain tips.

Further, in the case of such a conventional grinding machine as shown in FIGS. 6A and 6B, a cantilever type is often adopted, wherein a point at which the grindstone is suppressed is far away from a point of action at which processing is performed. In such a case, even if pressing is performed with a constant pressure according to sharpness of abrasive grains at the distal end of the grindstone, one end side of the grindstone is lifted due to the cantilever type, and an attitude of the grindstone itself is no longer parallel to the wafer. As a result, there is a problem that excess force acts on a local portion, and a site where the abrasive grain tips largely cut into the wafer occurs, which results in a crack. Therefore, when cutting is given to the wafer, the whole grindstone must be fed carefully such that one abrasive grain does not give a cut equal to or more than a predetermined breaking limit, while keeping the attitude of the grindstone stable and also taking into consideration the sharpness and/or degree of concentration of the abrasive grains.

In view of these circumstances, a technical problem to be solved that the wafer is stably ground while the fragile mode grinding is suppressed occurs, and an object of the present invention is to solve this problem.

SUMMARY OF INVENTION

The present invention has been proposed in order to solve the above problem, a first aspect of the present invention provides a grinding machine including: a rotatable spindle having a lower end to which a grindstone for grinding a wafer is attached; at least two linear guides extending in a vertical direction for slidably supporting the spindle to a column, the linear guides being arranged around an outer periphery of the spindle such that a processing point at which the grindstone grinds the wafer is included therebetween; and a spindle feeding mechanism feeding the spindle downward in the vertical direction, the grinding machine processing the wafer with the grindstone while feeding the spindle in the vertical direction, wherein constant-pressure cylinders are provided, the constant-pressure cylinders being interposed between the spindle feeding mechanism and the column, suspending the spindle and the spindle feeding mechanism, driving pressure being set to be equal to or less than a value corresponding to friction force acting on the grindstone when the spindle feeding mechanism causes the grindstone to cut into the wafer so that the grindstone cuts in by a critical cutting-in depth of the wafer, and raising the spindle and the spindle feeding mechanism when the driving pressure is reached.

According to this configuration, when a friction force acting on a grindstone becomes excessive due to the grindstone trying to cut in deeper than a desired grinding quantity, the constant-pressure mechanism raises the spindle and the spindle feeding mechanism temporarily so that the ductile mode grinding is performed in a so-called spindle floating state where the grindstone and the wafer does not excessively contact each other, stable grinding can be performed without damaging the wafer.

Further, since the grindstone is fed in the vertical direction, the grindstone and the spindle lower along a gravity direction to apply a force to the wafer. Even when the sharpness of the tip of the grindstone is changed, the wafer is pressed with a constant pressure, so that the grindstone cuts the wafer according to its sharpness. Thereby, as compared with a conventional configuration feeding a grindstone at a constant-speed, the grindstone cuts the wafer while being fed with a predetermined pressure according the sharpness of the grindstone, stable cutting is given, and occurrence of a crack can be suppressed. In addition, since the grindstone is fed automatically according to a speed at which an actual wafer is ground by processing, constant cutting-in process can also be continued stably during the processing.

Further, since the at least two linear guides are so arranged as to interpose the processing point therebetween, even when a reaction force due to the processing is applied to the grindstone, the grindstone is not inclined by the reaction force, but only pushed back upward in the vertical direction, so that the attitude of the grindstone is always parallel to the wafer, and the grindstone can be kept horizontal. Thereby, the grindstone can continue giving a constant cut while it is excessive processing stress is being suppressed at a portion of the grindstone. Further, when friction force acting on the grindstone becomes excessively large, the spindle and the spindle feeding mechanism suspended by the constant-pressure cylinder rise, and thereby the wafer is ground in the ductile mode in the floating state of the spindle with the attitude of the grindstone not changed but kept horizontal, so that grinding can be performed stably without damaging the wafer.

A second aspect of the present invention provides a grinding machine, the grinding machine wherein in addition to the configuration of the first aspect of the present invention, the constant-pressure cylinders are provided so as to interpose the spindle feeding mechanism therebetween at both sides of the spindle feeding mechanism in a horizontal direction perpendicular to the vertical direction, respectively.

According to this configuration, in addition to the advantageous effect of the first aspect of the present invention, when the spindle and the spindle feeding mechanism is raised, as the constant-pressure cylinders provided on both the sides of the spindle feeding mechanism in the horizontal direction is driven similarly, the spindle and the spindle feeding mechanism are restricted from movement thereof in the horizontal direction, so that the ductile mode grinding can be performed stably in the floating state of the spindle.

A third aspect of the present invention provides a grinding machine, wherein in addition to the configuration of the first or second aspects of the present invention, a feeding direction in which the spindle feeding mechanism feeds the spindle is arranged on straight line passing the vertical direction through the processing point at which the grindstone grinds the wafer.

According to this configuration, in addition to the advantageous effect of the first or second aspects of the present invention, since the feeding direction is arranged on the straight line along and parallel to the vertical direction and passing through the processing point of the grindstone, when grinding of the wafer is performed in the floating state of spindle, the spindle feeding mechanism feeds the spindle so as to suppress a reaction force occurring when the grindstone contacts the wafer, so that the ductile mode grinding can be performed stably in the floating state of the spindle.

A fourth aspect of the present invention provides a grinding machine, wherein in addition to the configuration of any one of the first to third aspects of the present invention, as the at least two linear guides, at least three linear guides are provided, and a gravity of the spindle is arranged within a polygon formed by the linear guides in a plan view.

According to this configuration, in addition to the advantageous effect of any one of the first to third aspects of the present invention, since the gravity of the spindle is arranged within the polygon formed by the linear guides, when friction force acting on the grindstone becomes excessively large and the constant-pressure cylinder raises the spindle and the spindle feeding mechanism, the linear guides arranged around the spindle restricts the attitude of the spindle so that the spindle is restrained from yawing, chipping, or rolling to the grinding machine and therefore the ductile mode grinding can be performed stably in the floating state of the spindle.

Advantageous Effect of Invention

In the present invention, when a friction force acting on a grindstone becomes excessively large trying to the grindstone being caused to cut in deeper than a desired grinding quantity, and thereby the constant-pressure feeding mechanism raises the spindle and the spindle feeding mechanism temporarily, the wafer is ground in the ductile mode in the floating state of the spindle, so that grinding can be performed stably without damaging the wafer. Further, since application of a constant pressure is performed by a natural weight, a constant pressure is always applied to a wafer surface according the sharpness of the abrasive grain tips, so that it becomes possible to perform grinding in the ductile mode while a constant cutting-in depth is being maintained and while a cutting quantity which does not cause a fatal problem to the wafer like crack occurrence is being maintained.

BEST MODE FOR CARRYING OUT INVENTION

For achieving an object of grinding a wafer while suppressing the fragile mode grinding, a grinding machine according to the present invention including: a rotatable spindle having a lower end to which a grindstone for grinding a wafer is attached: at least two linear guides extending in a vertical direction for slidably supporting the spindle to a column, the linear guides being arranged around an outer periphery of the spindle such that a processing point at which the grindstone grinds the wafer is included therebeween; and a spindle feeding mechanism feeding the spindle downward in the vertical direction, the grinding machine processing the wafer with the grindstone while feeding the spindle in the vertical direction, wherein constant-pressure cylinders are provided, the constant-pressure cylinders being interposed between the spindle feeding mechanism and the column, and suspending the spindle and the spindle feeding mechanism, driving pressure being set to be equal to or less than a value corresponding to friction force acting on the grindstone when the spindle feeding mechanism causes the grindstone to cut into the wafer so that the grindstone cuts in by a critical cutting-in depth of the wafer, and raising the spindle and the spindle feeding mechanism when the driving pressure is reached.

Any specific embodiment of the grinding machine according to the present invention can be adopted as long as it grinds a wafer in a ductile mode in a floating state where a spindle does not contact the wafer excessively while the grindstone is being preventing from cutting into the wafer beyond the cutting-in quantity equal to or more than a critical cutting-in depth of the wafer.

Embodiment

A grinding machine 1 according to an embodiment of the present invention will be described below. It should be noted that when the number of components, a numerical value, a quantity, a range, and the like are referred to a in the following embodiment, the number is not limited to a specific number, unless otherwise specified or unless the principle clearly limited them to the specific number, but may be equal to or more than or less than the specific number.

In addition, when shapes of the components and the like or positional relation between the components are referred to, they include substantially approximating or similar shapes or the like, unless otherwise specified or unless the principle clearly deny.

Further, the drawings may be exaggerated by enlarging a feature portions in order to facilitate understanding of features, and size ratios of components or the like may not be actual size ratios. Further, in sectional views, hatching of some components may be omitted in order to facilitate understanding of sectional structures of the component.

It is to be noted that the terms "upper" and "lower" correspond to upward and downward in a vertical direction in this embodiment.

Figure 1:
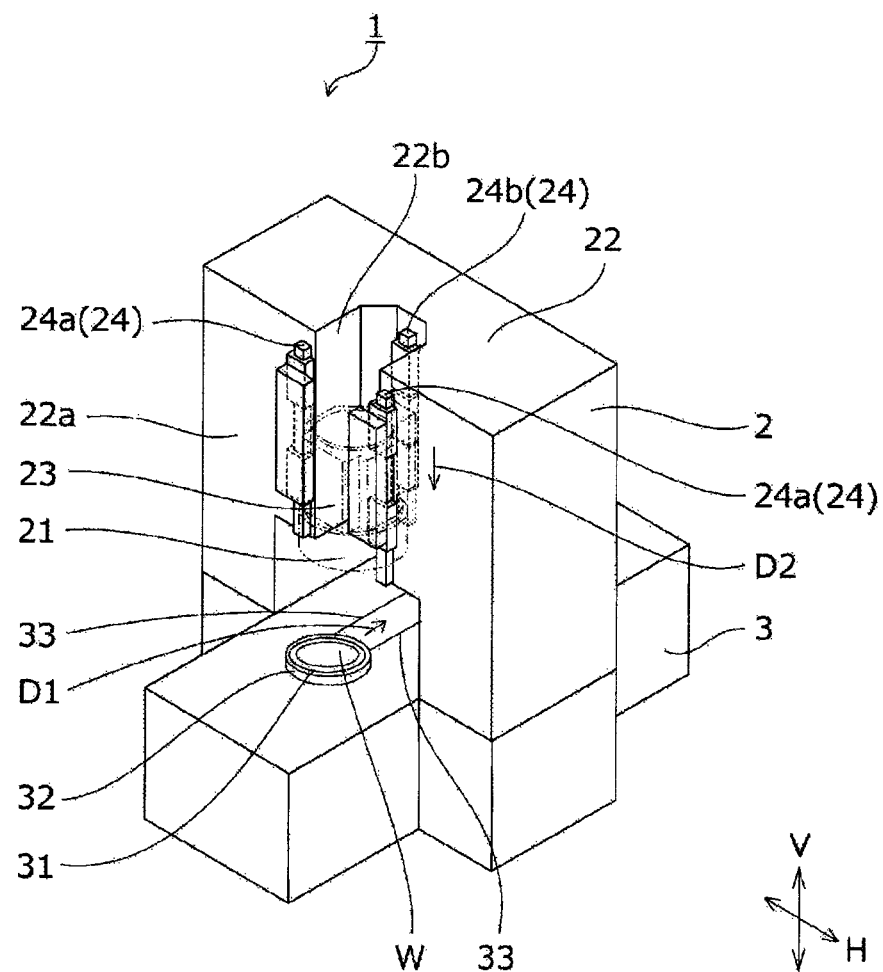
FIG. 1 is a perspective view showing a grinding machine according to an embodiment of the present invention.
Figure 2:
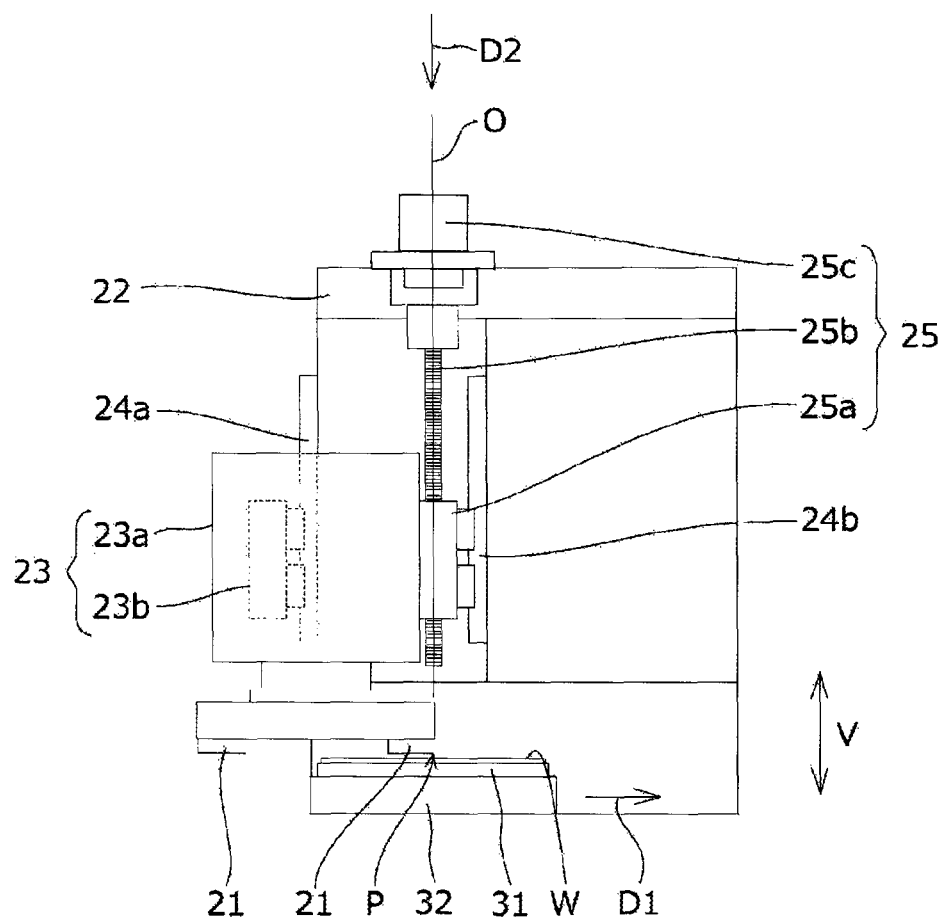
FIG. 2 is a plan view of a main unit shown in FIG. 1.
Figure 3:
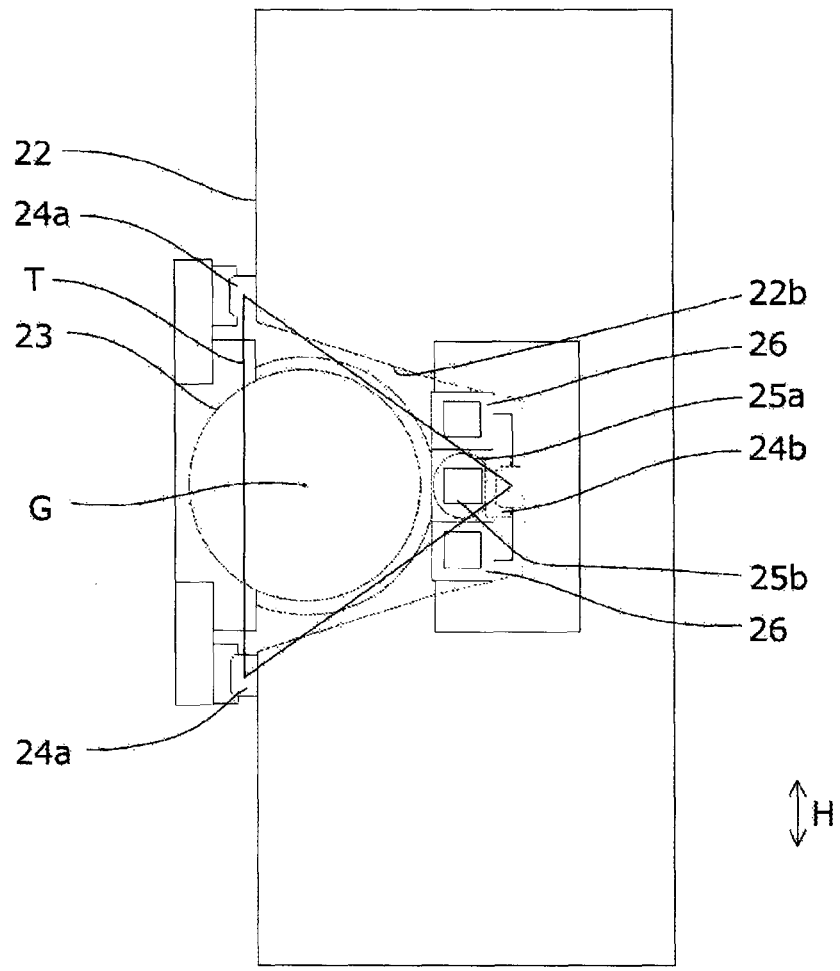
FIG. 3 is a side view of the main unit shown in FIG. 1.
Figure 4:
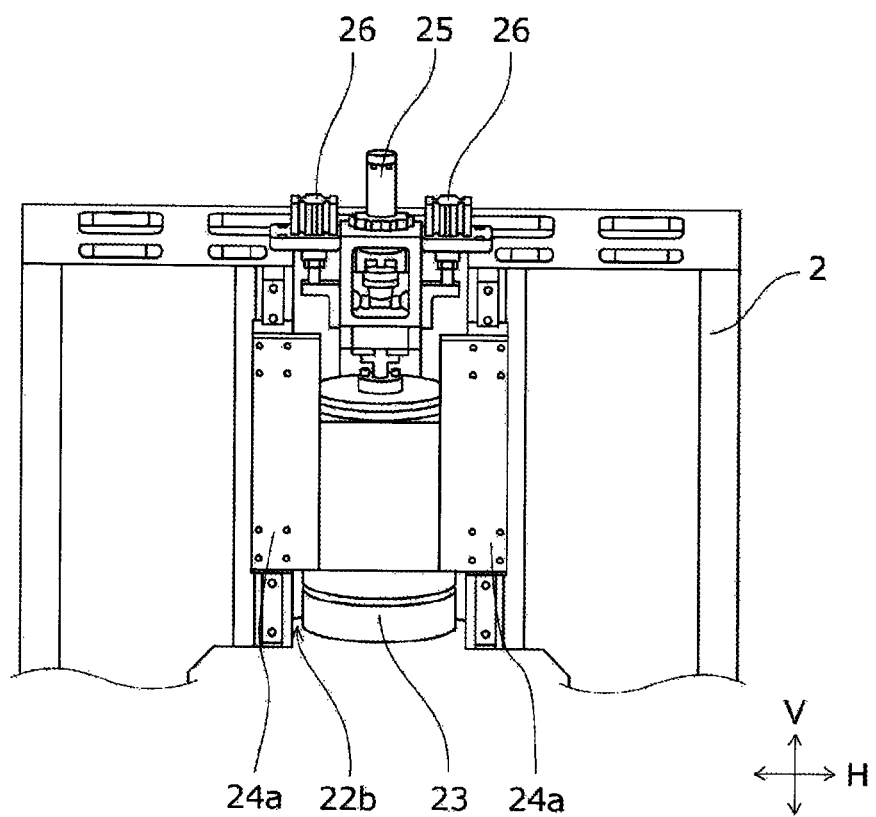
FIG. 4 is a perspective view showing an upper portion the main unit.

FIG. 1 is a perspective view showing a basic configuration of a grinding machine 1 where a constant-pressure feeding mechanism is omitted. FIG. 2 is a plan view of a main unit 2 shown in FIG. 1. FIG. 3 is a side view of the main unit 2. FIG. 4 is a perspective view showing an upper portion of the main unit 2.

The grinding machine 1 performs backgrinding of a wafer W into a thin film. The wafer W subjected to grinding process using the grinding machine 1 is preferably one showing high hardness and/or high fragility such as silicon wafer, silicon carbide wafer or the like, but the wafer W is not limited to these wafers. The grinding machine 1 is provided with the main unit 2 provided with a grindstone 21, and a conveying unit 3 arranged below the main unit 2.

The main unit 2 is provided with a arch-like column 22, a spindle 23 attached to the grindstone 21, three linear guides 24 supporting the spindle 23 slidably in a vertical direction V, and a spindle feeding mechanism 25 moving the spindle 23 upward and downward in the vertical direction V.

The conveying unit 3 is provided with a chuck 31 capable of sucking and holding the wafer W, and a slider 32 on which the chuck 31 is placed. The chuck 31 is connected to a vacuum source (not shown) and is capable of vacuum-sucking the wafer W to a surface of the chuck 31. Further, the chuck 31 can be rotated about a vertical axis passing through the center of the chuck 31 by a motor (not shown). The slider 32 can be slid on a rail 33 by a slider driving mechanism (not shown), so that the chuck 31 and slide 32 are slid in a wafer conveying direction D1 in an integral manner. Thus, the wafer W which has been vacuum-sucked on the chuck 31 is conveyed up to below the grindstone 21 by the slider 32 before the grinding processing, and it is conveyed from below the grindstone 21 to behind the main unit 2 after the grinding processing.

The operation of the grinding machine 1 is controlled by a control unit (not shown). The control unit is for controlling components constituting the grinding machine 1, respectively. The control unit is composed of a CPU, a memory or the like, for example. It should be noted that the function of the control unit may be realized by performing control using a software, or it may be realized by conducting an action using a hardware.

Next, a specific configuration of the main unit 2 will be described. The spindle 23 is received in a groove 22b provided in a front face 22a of the column 22 in a recessed manner and extending in the vertical direction V. The spindle 23 is provided with a saddle 23a having the grindstone 21 attached to its lower end, and a motor 23b provided within the saddle 23a to rotate the grindstone 21.

The linear guide 24 is composed of two front linear guides 24a arranged on the front of the column 22, and one rear linear guide 24b arranged in the groove 22b. The front linear guides 24a and the rear linear guide 24b are provided in parallel to one another along the vertical direction V. The saddle 23a is directly attached to the front linear guides 24a. Further, the saddle 23a is attached to the rear linear guide 24b via a nut 25a described later. Thereby, the front linear guides 24a and the rear linear guide 24b function as guide rails for the saddle 23a.

The front linear guides 24a are arranged at edge portions of the groove 22b. The rear linear guide 24b is arranged on a bottom portion of the groove 22b. As shown in FIG. 3, the front linear guides 24a and the rear linear guide 24b are arranged apart from one another such that gravity G of the spindle 23 is arranged within a triangle T formed by the front linear guides 24a and the rear linear guide 24b in a plan view.

The spindle feeding mechanism 25 is provided with a nut 25a coupling the saddle 23a and the rear linear guide 24b to each other, a ball screw 25b moving the nut 25a upward and downward, and a motor 25c for rotating the ball screw 25b. When the motor 25c is driven to rotate the ball screw 25b forward, the nut 25a is lowered in a feeding direction D2 of the ball screw 25b parallel to the vertical direction V, so that the saddle 23a is lowered. The feeding direction D2 is on a straight line parallel to the vertical direction V and passing through a processing point P at which the grindstone 21 processes the wafer W. In other words, a rotation axis O of the ball screw 25b and the processing point P of the grindstone 21 are arranged on the same straight line in the vertical direction V.

The spindle 23 and the spindle feeding mechanism 25 are coupled to a counterweight (not shown), and they are suspended by a constant-pressure cylinders 26 described later in a balanced state with the counterweight. Thereby, the spindle feeding mechanism 25 can lower the spindle 23 to a grinding start position at a high speed. Further, the grindstone 21 is caused to cut into the wafer W by a quantity corresponding to the spindle 23 fed by the spindle feeding mechanism 25, and a feeding quantity of the spindle feeding mechanism 25 can be known accurately according to a rotation quantity of the ball screw 25b, so that a grinding quantity can be controlled precisely.

The main unit 2 is provided with an in-process gauge (not shown) for measuring the thickness of the wafer W. When the thickness of the wafer W measured by the in-process gauge reaches a desired value, the motor 25c is driven to rotate the ball screw 25b backward, and the saddle 23a coupled to the nut 25a is raised, so that the wafer W and the grindstone 21 are separated from each other.

The main unit 2 is provided with the constant-pressure cylinders 26 as a floating mechanism. The constant-pressure cylinders 26 are provided so as to interpose the nuts 25a of the spindle feeding mechanism 25 therebeween at both sides one by one in a horizontal direction H, and they are interposed between the column 22 and the nuts 25a. The constant-pressure cylinder 26 is an air cylinder adopting a known configuration composed of a cylinder, a piston, a piston rod, a compressor and the like (not shown). A driving pressure of the constant-pressure cylinder 26 is set to be equal to or less than a value corresponding to a friction force acting on the grindstone 21 when the grindstone 21 cuts into the wafer W by the critical cutting-in depth (Dc value). The Dc value varies according to materials of the wafer W, and, for example, is 0.09 μm for a silicon wafer and is 0.15 μm for a silicon carbide wafer.

The constant-pressure cylinder 26 suspends the spindle 23 and the spindle feeding mechanism 25 within the groove 22b. Specifically, a lower end of the piston rod of the constant-pressure cylinder 26 are coupled to the nuts 25a, and when a friction force acting on the grindstone 21 is transmitted to the piston rod during the grinding processing, the piston is raised so as to press back compressed air filling in the cylinder of the constant-pressure cylinder 26. Therefore, when the friction force acting on the grindstone 21 is excessively increased by the grindstone 21 trying to cut deeper than a desired grinding quantity (for example, DC value), the spindle 23 and the spindle feeding mechanism 25 are temporarily raised. Thereby, it is suppressed that cutting by the grindstone 21 is equal to or more than the DC value. Further, even when a change in sharpness of the tip of the grindstone 21 causes an excessive increase in friction force, the constant-pressure cylinder 26 temporarily raises the spindle 23 and the spindle feeding mechanism 25, so that damage of the wafer W can be suppressed.

In addition, since the constant-pressure cylinder 26 does not press the spindle 23 downward in the vertical direction, and feeding (infeed) of the spindle 23 is performed only by the spindle feeding mechanism 25. The grindstone 21 is caused to cut into the wafer W by the feeding quantity of the spindle feeding mechanism 25 and the feeding quantity of the spindle feeding mechanism 25 can be known accurately from the rotation quantity of the ball screw 25b, so that the feeding quantity of the grindstone 21 can be controlled precisely. When the spindle feeding mechanism 25 causes the grindstone 21 to cut into the wafer W and friction force equal to or more than the driving pressure of the constant-pressure cylinder 26 acts on the grindstone 21, the constant-pressure cylinder 26 raises the spindle 23 and the spindle feeding mechanism 25.

Figure 5:
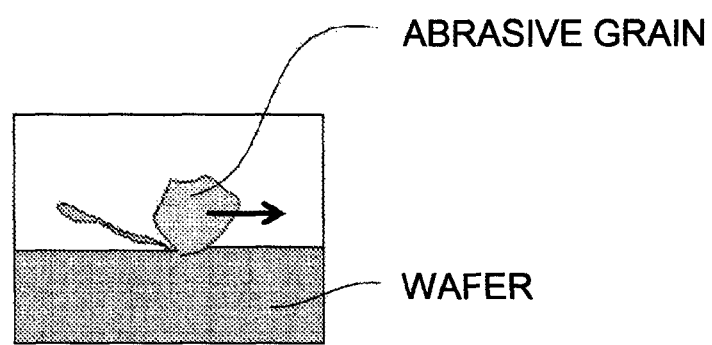
FIG. 5 is an illustrative view showing an aspect of ductile mode grinding.
Figure 6A:
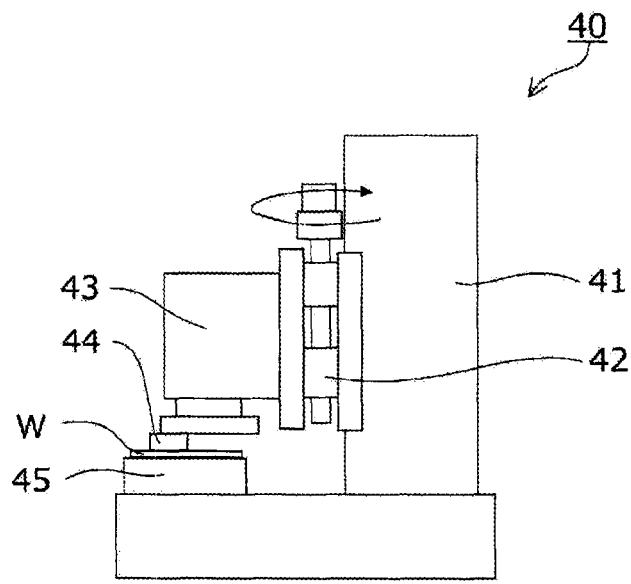
FIGS. 6A and 6B are illustrative views showing a conventional grinding machine, FIG. 6A being a view showing an aspect before grinding, and FIG. 6B being a view showing an aspect during grinding.
Figure 6B:
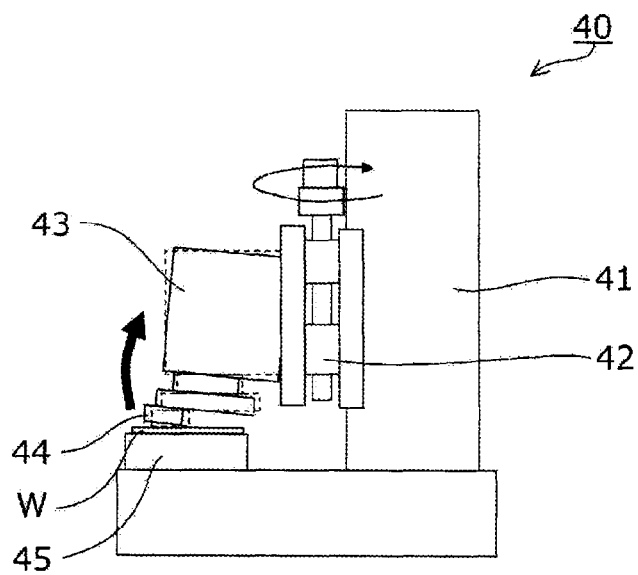
Figure 7:
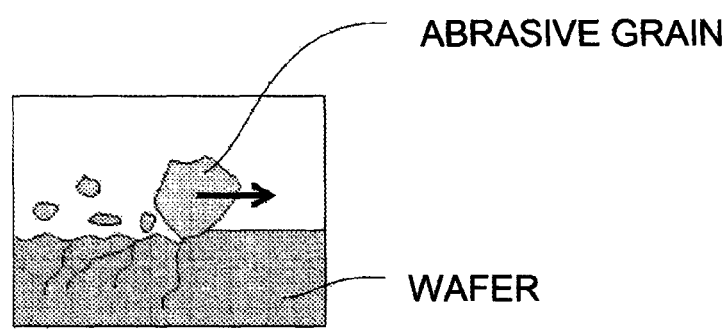
FIG. 7 is an illustrative view showing an aspect of a fragile mode grinding.

Further, since the constant-pressure cylinders 26 are provided at both side of the spindle feeding mechanism 25 in the horizontal direction H so as interpose the spindle feeding mechanism 25 therebetween, the spindle feeding mechanism 25 is prevented from being inclined in the horizontal direction H when the spindle feeding mechanism 25 is raised. Therefore, as shown in FIG. 5, the wafer W can be ground in the ductile mode in a so-called floating state where an abrasive grain of the grindstone 21 does not excessively contact the wafer W during the grinding processing.

As an example of specific processing conditions when a SiC substrate is ground in the ductile mode using the grinding machine 1, setting may be such that a grindstone 21 of #8000 is prepared, a rotation speed of the spindle 23 is 2000 rpm, a rotation speed of the chuck 31 is 300 rpm, a load during grinding is 20 kg, and a feeding speed of the spindle feeding mechanism 25 is 0.4 μm/s. Thereby, the SiC substrate can be ground in the ductile mode. It is noted that the term "load during grinding" corresponds to a driving pressure (500 kPa) of the constant-pressure cylinder 26 set when the grindstone 21 is separated from the wafer W by 1 μm.

In this manner, in the grinding machine 1 described above, when the friction force acting on the grindstone 21 becomes excessive due to the grindstone 21 trying to the grindstone 21 being caused to cut deeper than the desired grinding quantity, since the constant-pressure cylinder 26 raises the spindle feeding mechanism 25 temporarily to suppress pressure concentration at the processing point P, the wafer W is ground in the ductile mode with the spindle 23 floating, so that grinding can be stably performed without damaging the wafer W.

Further, since the constant-pressure cylinders 26 are provided so as to interpose the spindle feeding mechanism 25 therebetween, the spindle feeding mechanism 25 is restrained from moving in the horizontal direction H, so that the ductile mode grinding can be further stably performed in the floating state of the spindle 23.

In addition, since the feeding direction D2 is arranged on the straight line along and parallel to the vertical line V and passing through the processing point P of the grindstone 21, when grinding of the wafer W is performed in the floating state of the spindle 23, the spindle feeding mechanism 25 feeds the spindle 23 so as to suppress reaction force occurring when the grindstone 23 contacts the wafer W, so that the ductile mode grinding can be further stably performed in the floating state of the spindle 23. Further, since grinding is performed while the spindle 23 pressing the wafer only by its own weight along the vertical direction V, grinding can be performed with fine reduced sliding resistance and at slight cutting-in depth as compared with a conventional grinding machine feeding a grindstone in a horizontal direction to perform grinding.

Further, since the gravity G of the spindle 23 is arranged within the triangle T formed by the linear guides 24 in a plan view, the linear guides 24 arranged around the spindle 23 restricts the attitude of the spindle 23, so that the ductile mode grinding can be stably performed in the floating state.

It should be noted that the specific configuration of the floating mechanism is not limited to the above-described one, but any configuration can be adopted as long as the spindle can be so raised as to release excessive friction force acting on the grindstone.

Any specific configuration of the linear guide may be adopted as long as it is capable of restricting raising and lowering of the spindle to the vertical direction, and it is not limited to the such a configuration as described above in which the spindle is supported such that the gravity of the spindle is arranged within the polygon formed by the linear guides in a plan view, but it may be for example a configuration where the spindle is supported by two linear guides and the gravity of the spindle is arranged on a straight line formed by the two linear guides in a plan view.

It should be noted that the present invention can be variously modified without departing from the spirit of the invention, and the present invention includes such modifications.

What is claimed is:

1. A grinding machine comprising: a rotatable spindle having a lower end to which a grindstone for grinding a wafer is attached; at least two linear guides extending in a vertical direction for slidably supporting the spindle to a column, the linear guides being arranged around an outer periphery of the spindle such that a processing point at which the grindstone grinds the wafer is included therebetween; and a spindle feeding mechanism feeding the spindle downward in the vertical direction, the grinding machine processing the wafer with the grindstone while feeding the spindle in the vertical direction, wherein constant-pressure cylinders are provided, the constant-pressure cylinders being interposed between the spindle feeding mechanism and the column for suspending the spindle and the spindle feeding mechanism, wherein during grinding a driving pressure of the cylinders is set to be equal to or less than a predetermined value corresponding to a friction force acting on the grindstone when the spindle feeding mechanism causes the grindstone to cut into the wafer so that the grindstone cuts in by a critical cutting-in depth of the wafer, and raising the spindle and the spindle feeding mechanism during grinding when the driving pressure exceeds the predetermined value of the friction force.

2. The grinding machine according to claim 1, wherein the constant-pressure cylinders are provided so as to interpose the spindle feeding mechanism at both sides of the spindle feeding mechanism in a horizontal direction perpendicular to the vertical direction, respectively.

3. The grinding machine according to claim 1, wherein a feeding direction in which the spindle feeding mechanism feeds the spindle is arranged on a straight line passing along the vertical direction through the processing point at which the grindstone grinds the wafer.

4. The grinding machine according to claim 1, wherein as the at least two linear guides, at least three linear guides are provided, and
  a gravity of the spindle is arranged within a polygon formed by the linear guides in a plan view.

* * * * *